(12) United States Patent
Too et al.

(10) Patent No.: US 9,146,062 B2
(45) Date of Patent: Sep. 29, 2015

(54) INTERLOCKING CLIP HEATSINK MOUNTING SYSTEM

(71) Applicants: Thierry Sin Yan Too, San Ramon, CA (US); Mong Hu, San Jose, CA (US)

(72) Inventors: Thierry Sin Yan Too, San Ramon, CA (US); Mong Hu, San Jose, CA (US)

(73) Assignee: Radian Thermal Products, Inc., Santa Clara, CA (US)

( * ) Notice: Subject to any disclaimer, the term of this patent is extended or adjusted under 35 U.S.C. 154(b) by 305 days.

(21) Appl. No.: 13/782,699

(22) Filed: Mar. 1, 2013

(65) Prior Publication Data
US 2014/0248081 A1 Sep. 4, 2014

(51) Int. Cl.
*H05K 7/20* (2006.01)
*F28F 9/26* (2006.01)

(52) U.S. Cl.
CPC ............. *F28F 9/26* (2013.01); *H05K 7/20418* (2013.01); *Y10T 403/7064* (2015.01)

(58) Field of Classification Search
CPC combination set(s) only.
See application file for complete search history.

(56) References Cited

U.S. PATENT DOCUMENTS

| | | | | |
|---|---|---|---|---|
| 5,493,475 A | * | 2/1996 | Lin | 361/710 |
| 6,157,536 A | * | 12/2000 | Huang et al. | 361/740 |
| 6,160,709 A | * | 12/2000 | Li | 361/704 |
| 6,193,205 B1 | * | 2/2001 | Wang | 248/510 |
| 6,343,017 B1 | * | 1/2002 | Yu et al. | 361/704 |
| 6,344,971 B1 | * | 2/2002 | Ju | 361/704 |
| 6,480,386 B1 | * | 11/2002 | Yu | 361/704 |
| 6,542,369 B1 | * | 4/2003 | Wu | 361/704 |
| 2008/0298022 A1 | * | 12/2008 | Li | 361/710 |

* cited by examiner

*Primary Examiner* — Gregory Thompson
(74) *Attorney, Agent, or Firm* — Michael J. Hughes

(57) ABSTRACT

An interlocking clip heatsink mounting system (10) is provided for securing a heatsink (12) in optimal thermal contact with a chip carrier (14). The clip structure (24) includes a pair of identical interlocking clip members (28) and a spring member (26). The clip side members (28) are provided with crenellations (50) and hook wedges (62) so as to interlock in partially engaged and fully engaged modes.

15 Claims, 5 Drawing Sheets

INTERLOCKING CLIP HEATSINK MOUNTING SYSTEM

TECHNICAL FIELD

The present invention relates generally to semiconductor cooling methods and more specifically to a self-lockable and releasable mounting system for mounting heatsink elements onto semiconductor chips mounted on or in planar carriers.

BACKGROUND ART

Many electronic components such as IC chips require cooling structures such as heatsinks to conduct and radiate heat away from the electronic components. Conductive heatsink components, which come in a wide variety of forms, must be held against the surface of the chips in order to function effectively. However, it is often desirable to mount the heatsink in a removable manner. Consequently, a need exists to provide economical, simple and stable systems for mounting the heatsinks on the chips and boards.

An example of a stable and adjustable heatsink mount is found in U.S. Pat. No. 5,932,925 to Gerald McIntyre, assigned to Intricast, Inc. of Santa Clara Calif. This patent shows a novel method of providing a resilient adjustable pressure to the heatsink in order to maintain it in abutment against the semiconductor such that maximum conductive heat transfer may occur. The present inventors have also collaborated on addition improvements in the field as shown in U.S. Pat. Nos. 7,848,107 and 8,254,793.

There remains a need for heatsink mounting systems for electronic components which are readily attachable and detachable, while maintaining good heat transference. Accordingly, there is a need in the industry for a system such as the presently preferred invention.

DISCLOSURE OF INVENTION

Accordingly, it is an object of the present invention to provide a simple-lightweight system for mounting a heatsink device on a semiconductor chip or chip board which is easily attached and removed.

A further object is to provide a mounting system which is simple, lightweight and economical.

Another object of the present invention is to provide a mounting clip structure with symmetrical interlocking components.

An additional object of the invention is to provide a heatsink and carrier which are in the form of a loosely pre-assembled unit which may simply be snap clipped onto a chip package for quick installation.

Yet another object of the invention is to provide a heatsink mounting system which does not require any modifications to the circuit board upon which the chip is secured.

Still another object of the invention is to provide a heatsink mount which frames both the heatsink itself and the chip package at all four corners to maintain stable centering and contact.

Briefly, one presently preferred embodiment of the present invention is a heatsink mount adapted to releasably secure a heatsink to the surface of a generally rectangular electronic component. The mount system includes a pair of symmetrical interlocking clip side members for capturing and positioning the heatsink and holding it securely on a chip carrier, such as a ball grid array (BGA). The clip sides include support ledges for extending beneath the edge of the chip/board to secure the mount and heatsink thereto. Each clip side further includes spring capture protrusions on the exterior of the frame to secure an end of a resilient spring member to firmly engage the chip carrier in use. The recurve spring extends across the heatsink and provides downward force in its center extent to engage the heatsink and to provide pressure thereto to maintain contact with the support ledges prior to engagement and with the chip when the assembly is engaged.

An advantage of the present invention is that the heatsink mount may be easily installed and removed using only finger pressure.

A further advantage of the present invention is that the mounting structure is modular, lightweight, and simple to use.

Yet another advantage of the present invention is that the securing provided by the grip tongues does not work loose during ordinary usage.

Another advantage of the present invention is that no tools are needed by the end user for installation or removal.

A further advantage of the present invention is that the identical clip side members provide for ease and economy of manufacture and simplicity of understanding.

These and other objects and advantages of the present invention will become clear to those skilled in the art in view of the description of the best presently known modes of carrying out the invention and the industrial applicability of the preferred embodiments as described herein and as illustrated in the several figures of the drawings.

BRIEF DESCRIPTION OF THE DRAWINGS

The purposes and advantages of the present invention will be apparent from the following detailed description in conjunction with the appended drawings in which.

BEST MODE FOR CARRYING OUT THE INVENTION

Figure 1:
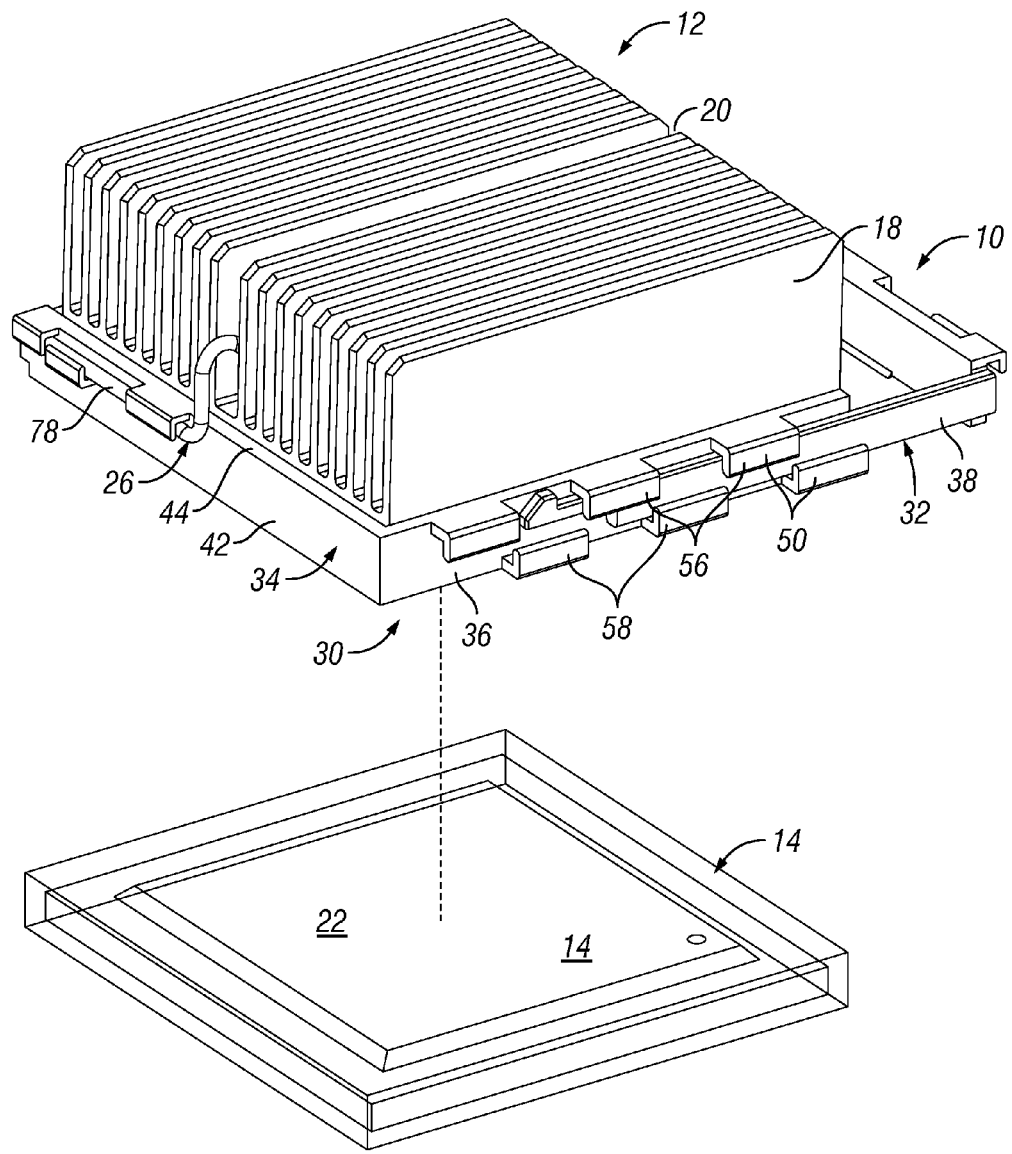
FIG. 1 is an exploded perspective view of the presently preferred embodiment of the present invention partially installed on a typical heatsink and including an illustration of a semiconductor chip.

The present invention is a simple and elegant mounting system a heatsink on a planar carrier. The preferred embodiment is illustrated in the several figures of the drawing and designated therein by the general reference character 10. The preferred system is referred to as an Interlocking Clip System or "ICS" 10. The ICS 10 is adapted particularly for capturing a typical heatsink 12 and securing it against a chip carrier 14 or other electronic component in need of heat dissipation.

The ordinary type of heatsink 12 has a baseplate 16 and a plurality of upright heat dissipation fins 18. A central gap 20 exists between a pair of centrally located fins 18. The typical chip carrier 14 is a ball grid array (BGA) having a generally planar upper surface 22 against which the bottom of base plate 16 optimally rests for conductive heat transfer.

Figure 3A:
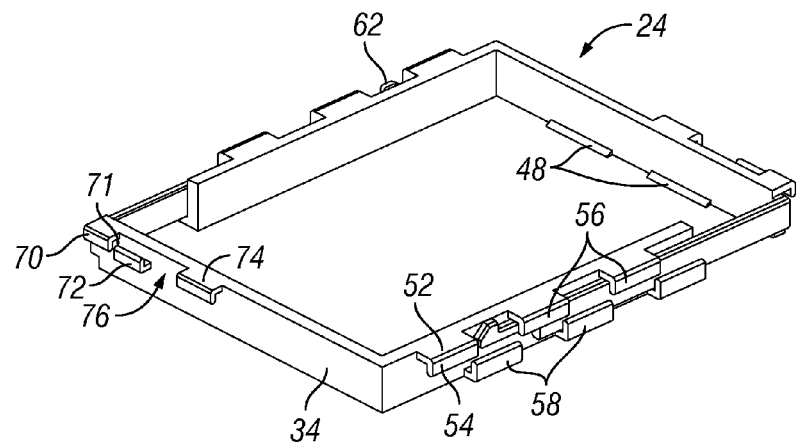
FIG. 3A is a perspective view showing the opposing clip side members in a partially engaged mode.

The ICS 10 includes a clip structure 24 and spring 26. The clip structure 24 includes a pair of clip members 28, referred to as a first clip 30 and a second clip 32. The clip members 28, 30 and 32 are in fact identical in structure but are constructed such that, when one is reversed with respect to the other, it mates with and nests into the other. In the illustrations, particularly evident in FIGS. 3A and 3B, this symmetry is clear.

Each clip member 28 includes a central panel 34, with a crenellated arm 36 and a prong arm 38 extending at right angles from opposing ends of the central panel 34. Each clip member 28 (and each component panel and arm thereof) also includes an interior (inner) surface 40, which will abut against the heatsink 12, an exterior (outer) surface 42, a top surface 44, and a bottom surface 46.

The central panel 34 is provided with a pair of support ledges 48, spaced apart on the inner surface 40 near the bottom 46. The support ledges are adapted to fit under the heatsink 12 prior to installation and under the BGA 14 after installation to vertically restrict the combined structures. Since support ledges 48 are provided on each of the opposing central panels 34 vertical support is provided on two opposing sides of the heatsink 12 and BGA 14 for stability. Lateral stability and restriction is provided by the inner surfaces 40 abutting against the components.

The crenellated arms 36 are of nearly equal length to central panels (shorter by the thickness of the central panel 34) such that, when fully installed, the two opposed side members 30 and 32 define an interior square. This relationship may be modified in the event that the desired heatsink 12 and BGA 14 are not square. The height of the crenellated arm 36 is the same as that of the central arm 34 with each being somewhat greater than the combined thickness of the base plate 16 and the BGA 14.

The outer surface 42 of each crenellated arm 36 is provided with a series of crenellations 50 opposingly staggered at the top 44 and bottom 46. Each crenellation 50 includes a lateral protrusion 52 and a vertical hook panel 54 extending toward the opposing crenellations 50. In the preferred embodiment 10 each crenellated arm is provided with six crenellations 50 with three top crenellations 56 alongside the top surface 40 and three bottom crenellations 58 spaced alongside the bottom surface 42. These are alternately spaced with the outermost bottom crenellation 58 situated at the distal end of the crenellated arm 36 and the innermost top crenellation 56 situated so as to be displaced by a small amount from the proximal end.

Each prong arms 38 is slightly shorter than the crenellated arm 36 and is mounted slightly offset on the central panel 34 so as to abut against the outer surface 42 of the opposing crenellated arm 36 when engaged. The body of the prong arm 38 has substantially less height (by about the thickness of two lateral protrusions 52 of the crenellations 50) than the central panel 34 and the crenellated arm 36.

Near the distal end of the prong arm 38 a hook extension 60 is provided extending along the top surface 40. The hook extension 60 has a significantly reduced height for the purpose of providing vertical deformability. A hook wedge 62 extends from the extension arm. The hook wedge 62 includes an inclined distal surface 64 and extends vertically above the prong arm 38 to form a rear notch 66 adapted to elastically capture the proximal edge of a top crenellation 56.

As best seen in FIGS. 1, 2A, 3A, and 4A, on the outer surface 42 of the central panel 34 near the top surface 44, is a spring capture structure 68. The spring capture structure 68 includes a terminal block 70 having an aperture 71 formed therein, a middle crenellation 72 and an upper crenellation 74 with a moderate lateral gap 76 between the crenellations 72 and 74. The terminal block 70 is adjacent to the prong arm 38 and the distal end of the top crenellation 74 is situated near the midpoint of the central panel 34 so as to be aligned with its opposing component on the other clip side member 28, and also aligned with the central gap 20 of the heatsink 12.

Figure 2A:
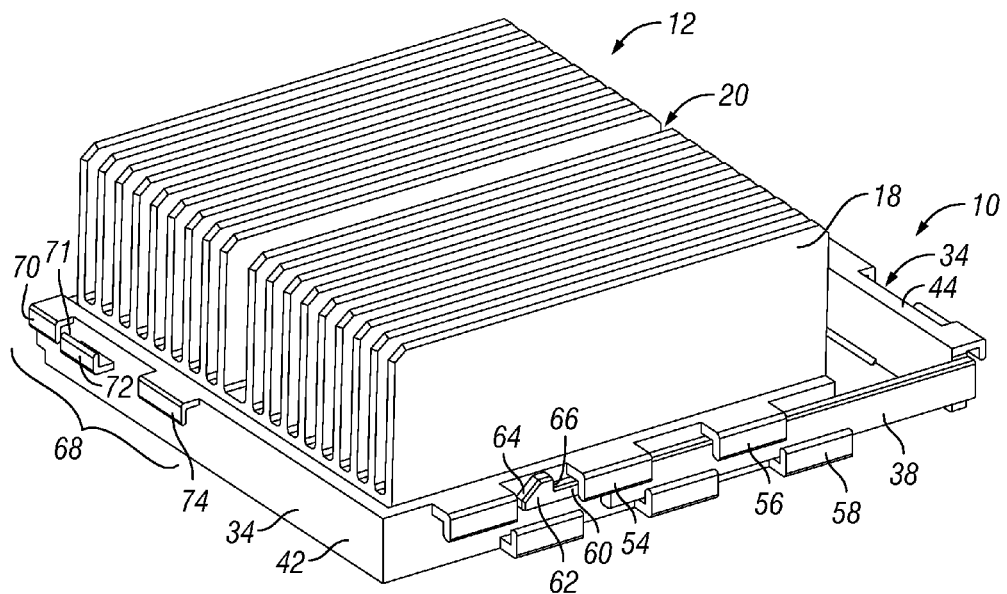
FIG. 2A is a perspective view of the heatsink mounting system of FIG. 1, shown with a heatsink therewithin.
Figure 2B:
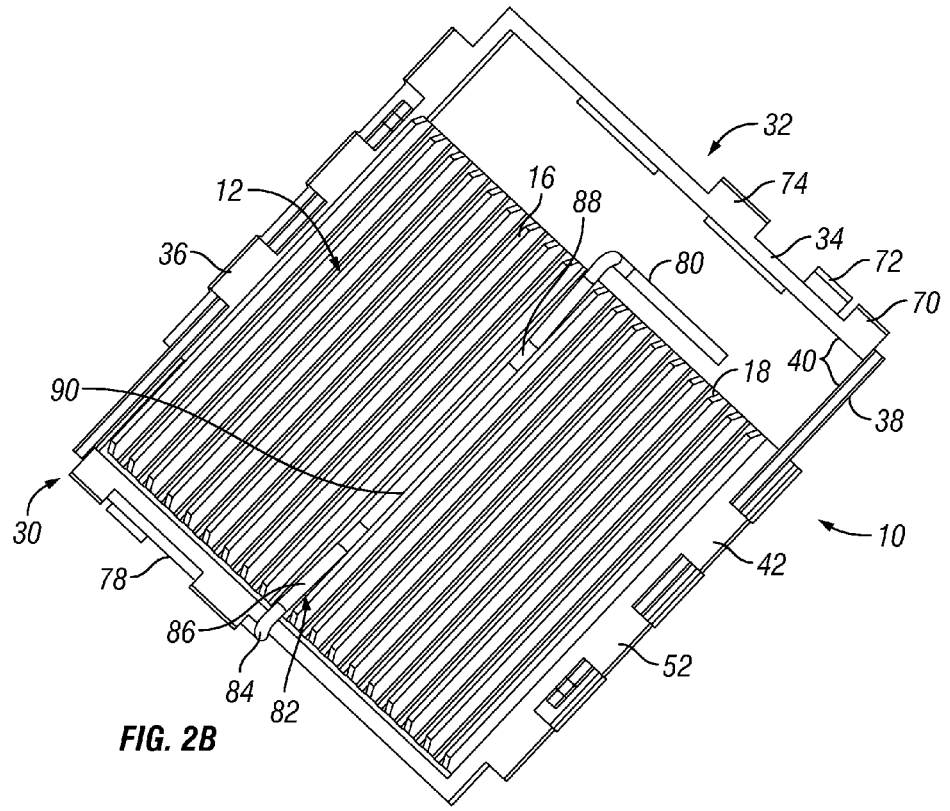
FIG. 2B is a top view of a partially installed mounting system.
Figure 4A:
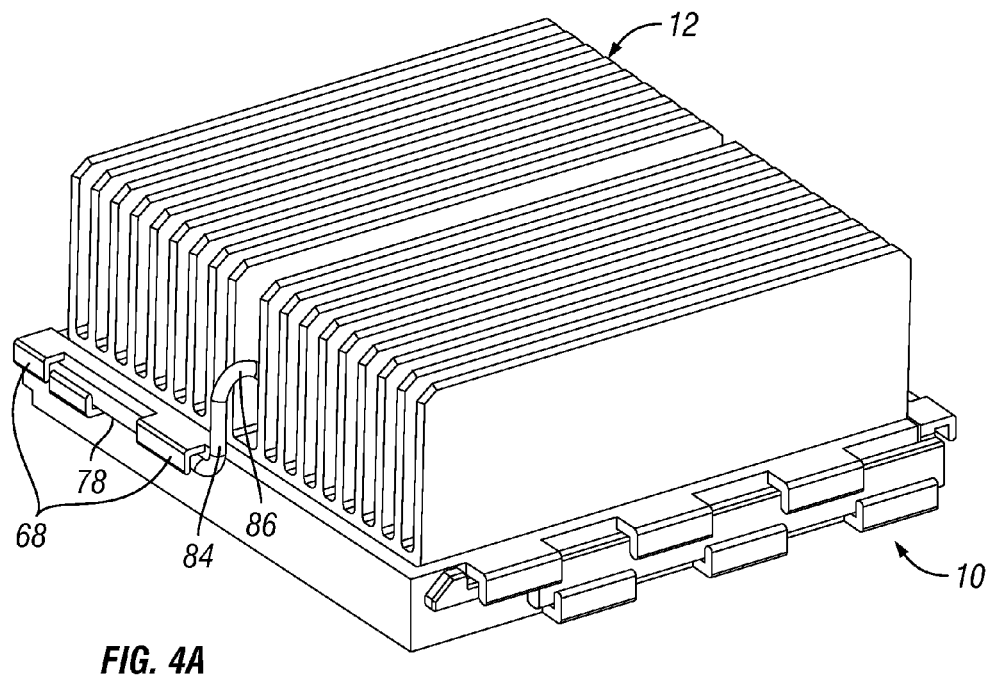
FIG. 4A is a side perspective view of the heat sink mounting system of FIG. 1, showing a fully installed mounting system on a heatsink.
Figure 4B:
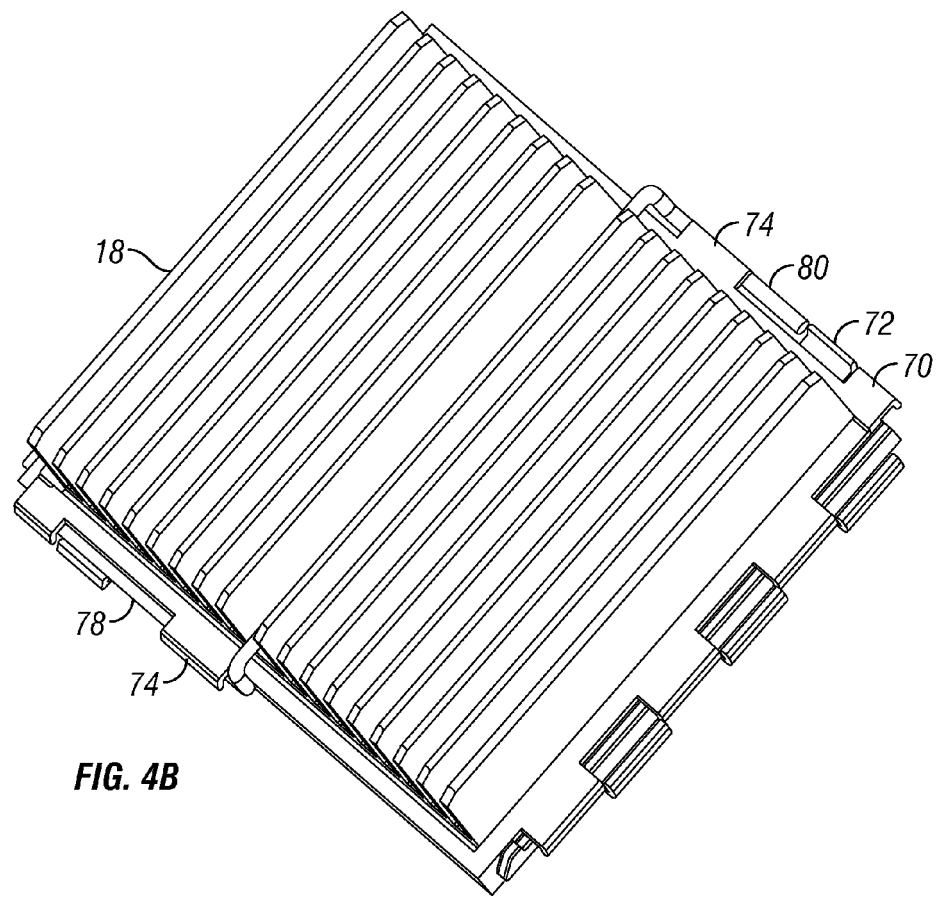
FIG. 4B is top view of the structure of FIG. 4A.

The spring member 26 is best illustrated in FIGS. 2B and 4B. As seen in FIG. 2B the spring 26, when viewed from above is generally "Z-shaped". It is a continuous metallic spring with the purpose of providing and maintaining tension on the base plate 16 in order to provide maximal conductive contact between the heatsink 12 and the BGA 14, in order to optimize thermal transfer for heat dissipation.

The spring 26 includes a long arm 78 and a short arm 80 at either end of a central expanse 82. The long arm 78 is adapted to engage all of the spring capture structure 68 on the first clip 30, being inserted between the upper crenellation 74 and the middle crenellation 72 until the end of the long arm 78 extends into the aperture 71 in the terminal block 70 and is fully captured. In full installation mode (FIG. 4B) it may be seen that the short arm 80 only extends far enough into the spring capture structure 68 on the second clip 32 such that it captured only under the upper crenellation 74. This partial capture of the short arm 80 facilitates easy manual engagement and disengagement of the spring 26 when desired.

The central expanse 82 is symmetrical about a midpoint plane and includes a vertical segment 84 at each end to connect to the long arm 78 and the short arm 80. In the preferred embodiment 10, the central expanse 82 of the spring 26 then includes a short horizontal segment 86 extending inward from each vertical segment 84 to an inclined segment 88 which connects to a single bottom leaf segment 90. The bottom leaf segment 90 is resilient such that, when fully engaged, it presses evenly over a significant extent of the base plate 16 in the central gap 20 to provide optimal force on the heatsink 12 against the BGA 14.

The clip members 28 are preferably constructed of lightweight and somewhat resilient plastic material such as ABS, Nylon, or Polycarbonate. The spring 26 is constructed of resilient spring materials such as spring steel (Music Wire) or stainless steel or high carbon steel. The dimensions of the embodiments are dependent upon the nature of the heatsink and BGA to be contained, although it is envisioned that the rectangular overall shape will nearly always be desired.

While various embodiments have been described above, it should be understood that these have been presented by way of example only, and not as providing any limitation on the invention.

INDUSTRIAL APPLICABILITY

The presently preferred heatsink mounting system 10 of the present invention is adapted for use in holding heatsink components 12 in optimal conductive contact with electronic components such as BGA type chip carriers 14. The capacity to easily install and remove the installation, the security of the mounting and the ability to ship the capture assembly and heatsink together in partially engaged form are all advantages which make the inventive ICS mounting system 10 desirable.

A typical usage will be in electronic systems where a BGA chip or other component generates excess heat during use, which heat must be dissipated for better performance and to avoid degradation. The BGA chip 14 will be secured in position within an enclosed space. The BGA 14 provides a planar conductive surface presented for abutment against the base plate 16 portion of a heatsink 12.

Figure 4C:
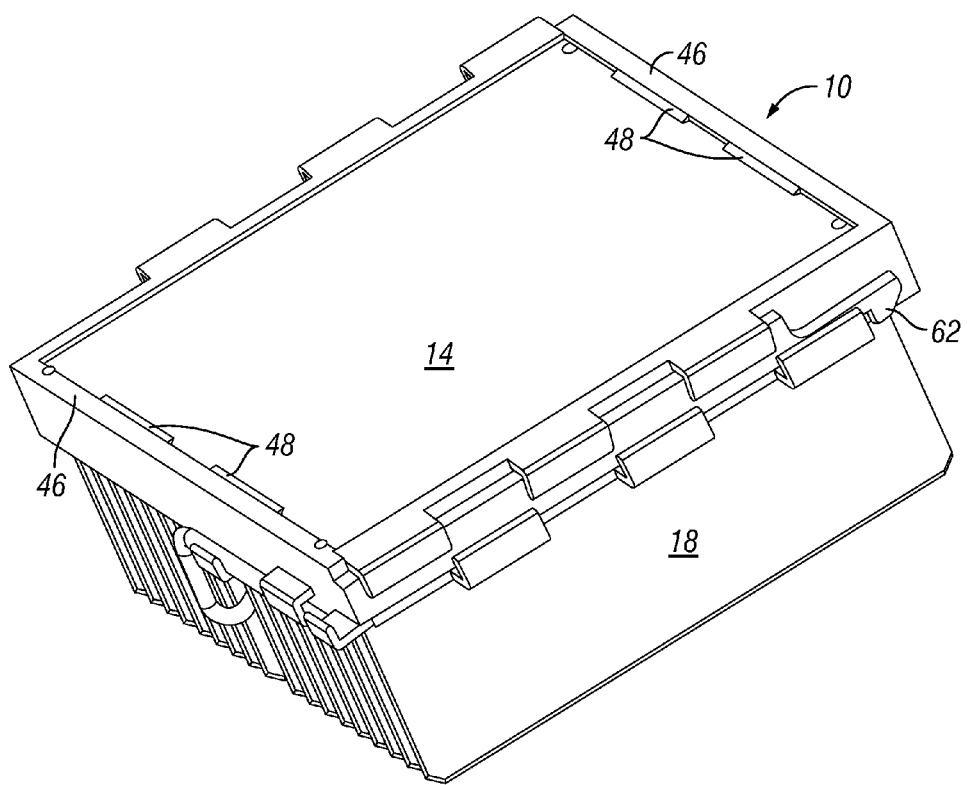
FIG. 4C is a bottom perspective view of the structure of FIG. 4A.

The object of the present invention is to firmly secure continuous and effective contact between the base plate 16 and the BGA chip 14 in order to optimize thermal dissipation. This is accomplished by securing the heatsink 12 in position against the chip 14 utilizing the ICS (Interlocking Clip System) 10 of the present invention as particularly shown in FIG. 1 and the views of FIG. 4A-C.

Figure 3B:
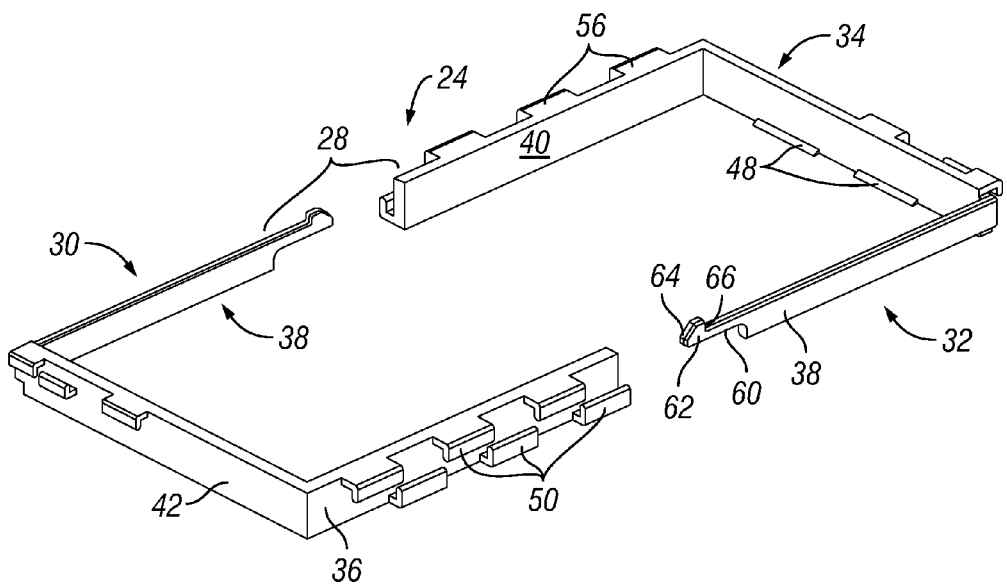
FIG. 3B shows the clip side members in a disengaged mode.

In the preferred method of use, the ICS 10 and the desired heatsink 12 are packaged and shipped to the user in partially assembled mode as shown in FIGS. 2A and 2B. The identical components referred to as the first clip 30 and the second clip 32 are selected, with the second clip 32 arrayed in a reverse orientation to the first clip 30, as shown in FIG. 3B. The heatsink 12 is then placed into the combination with its base resting on the support ledges 48 of the first clip 30. The clip members 28 are partially pressed together so the respective prong arms 38 are engaged with the crenellations 50 of the crenellated arms 36, partially but not completely, with the rear notch 66 of the hook wedge 62 resting only against the middle one of the top crenellations 56. It is noted that the inclined distal surface 64 of the hook wedge 62 makes it easy to push the prong arm 38 between the crenellations 50 while the elasticity of the hook extension 60 allows it to snap upward between top crenellations 56 to secure the position. This results in the configuration of FIG. 2A.

The spring member 26 is then partially installed as shown in FIG. 2B. The long arm 78 is inserted between the upper crenellation 74 and the middle crenellation 72 such that the tip of the long arm 78 is captured in the aperture 71 in the terminal block 70. At this point the entire spring 26 is rotated about the long arm 78 such that the central expanse 82 rests in the central gap 20 between the cooling fins 18 of the heatsink 12. The partial assembly is then inserted into a plastic bag or similar for delivery to the end user.

Once the ICS 10 is brought to the desired BGA 14 the assembly is placed such that the support ledges 48 of the first clip 30 are underneath the edge of the BGA chip 14 and the heatsink 12 is displaced therefrom by the thickness of the BGA chip 14. The spring 26 is rotated upward enough that the short arm 80 is out of the way and the enclosure is completed by pushing the second clip 32 further into engagement with the first clip 30, with the positioning carefully arranged such that the support ledges 48 of the second clip 32 engage under the opposite side of the BGA chip 14 as shown in FIG. 4B. Once each hook wedge 62 is pushed past the last proximal top crenellation 56 it snaps into place and the rear notch 66 secures it into place, fully laterally capturing the BGA 14 and heatsink 12. Finally, the spring 26 is rotated down and the short arm 80 is snapped into position under the upper crenellation 74 of second clip 32 (see FIG. 4B). This forces the bottom leaf segment 90 to depress against the base plate 16 and secure planar pressure against the BGA 14.

Disassembly is also easily accomplished by releasing the short arm 80 of the spring 26 and disengaging the clip members 28 by depressing each hook wedge 62 at each interstice between top crenellations 56 until the prong arm 38 is free.

It is noted that nothing more than finger pressure is required at any stage of installation or disassembly. No special tools are needed. This makes the ICS 10 particularly valuable and convenient for the user.

The interlocking clip mounting system 10 is adaptable in that the components may be manufactured to custom sizes and shapes to accommodate different types of heatsinks 12. Varying spring members 26 may be interchanged to modify the pressure applied to the heatsink 12. All of these features make the system adaptable to a multitude of uses.

For the above, and other, reasons, it is expected that the heatsink mounting system of the present invention will have widespread industrial applicability. Therefore, it is expected that the commercial utility of the present invention will be extensive and long lasting.

What is claimed is:

1. A heatsink mounting system for holding a heatsink against a heat generating component, comprising:
   a first clip member having a central panel, a crenellated arm and a prong arm;
   a second clip member for interlocking with said first clip member, said second clip member being identical to said first clip member but reversed in orientation; and
   a spring member, extending across and engaging each of said clip members, for engaging an upper surface of the heatsink to hold it in position against the heat generating component, wherein
   said prong arm includes a hook wedge on an elastic hook extension; and
   said crenellated arm includes at least two spaced apart crenellations on its outer surface for releasably capturing said hook wedge in multiple locations to provide for partial and complete engagement between said first clip member and said second clip member.

2. The heatsink mounting system of claim 1, wherein each said central panel includes at least one support ledge on the bottom of the interior surface thereof to fit underneath the heatsink and heat generating component.

3. The heatsink mounting system of claim 1, wherein each said central panel includes a spring capture structure on its outer surface; and
   said spring member includes arms on each end thereof to releasably mate with respective ones of said spring capture structures.

4. The heatsink mounting system of claim 3, wherein each said spring capture structure includes a top crenellation and a bottom crenellation; and
   said arms on each end of said spring member are in the form of a long arm on one end and a short arm on the other end.

5. The heatsink mounting system of claim 1, wherein said spring member includes a pair of terminal arms for engaging with said central panels of said clip members and a central expanse for extending across said heatsink, said central expanse including a bottom leaf portion for engaging and applying force against said heatsink.

6. The heatsink mounting system of claim 5, wherein said pair of terminal arms includes a long arm on one end and a short arm on the other end.

7. An interlocking clip system for capturing and securing a heatsink against a heat generating component, comprising:
   a pair of identical clip members, adapted to interlock with each other and laterally encompass the heatsink, each including at least one support ledge on at least one interior surface thereof for fitting underneath the heatsink and heat generating component, and each further including spring capture structures; and
   a spring member including a central expanse adapted to force the heatsink against the heat generating component and two terminal arms for engaging said spring capture structures on each of said clip members, wherein
   each said clip member includes a central panel with a crenellated arm extending at a right angle from one end thereof and a prong arm, parallel with said crenellated arm, extending from the other end of said central panel;
   said at least one support ledge is situated on said central panel; and said prong arm is shorter than said crenellated arm and terminates with a hook wedge adapted to detachably engage with crenellations on said crenellated arm of the opposing one of said clip members.

8. The interlocking clip system of claim 7, wherein said spring member includes said two terminal arms for engaging with said spring capture structures and said central expanse for extending across said heatsink, said central expanse including a bottom leaf portion for engaging and applying force against said heatsink.

9. The interlocking clip system of claim 7, wherein said spring member further includes a pair of vertical segments situated intermediate said terminal arms and said central expanse.

10. The interlocking clip system of claim 7, wherein said prong arm is adapted to engage said crenellated arm in either a partially engaged position or a fully engaged position.

11. The interlocking clip system of claim 7, wherein each said spring capture includes a terminal block to capture an end of a respective one of said terminal arms.

12. The interlocking clip system of claim 11, wherein each said terminal block includes an aperture to receive an end of said respective one of said terminal arms.

13. A heatsink mounting system comprising
a first clip member and a second clip member for laterally fully capturing a heatsink therebetween, said first and second heatsink members being identical in structure; wherein
each said first and second clip member includes a prong arm on one end and a crenelated arm on the other end, said crenelated arm including a series of spaced apart crenellations adapted to receive said prong arm; and
said first and second clip members are adapted to releasably interlock with each other both in a partially engaged mode and a fully engaged mode.

14. The heatsink mounting system of claim 13, wherein said first and second clip members include at least one support ledge on at least one interior surface thereof for fitting underneath the heatsink.

15. The heatsink mounting system of claim 13, and further comprising
a spring member to extend across between and engage said first and second members to apply a downward force on said captured heatsink.

* * * * *